United States Patent
Li et al.

(10) Patent No.: US 9,844,150 B2
(45) Date of Patent: Dec. 12, 2017

(54) VISUAL INDICATING DEVICE

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Jie Li, Wuhan (CN); Shen-Fa Tsai, New Taipei (TW)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 259 days.

(21) Appl. No.: 14/683,755

(22) Filed: Apr. 10, 2015

(65) Prior Publication Data

US 2016/0169489 A1 Jun. 16, 2016

(30) Foreign Application Priority Data

Dec. 12, 2014 (CN) .......................... 2014 1 0760973

(51) Int. Cl.
| | | |
|---|---|---|
| *H05K 3/30* | (2006.01) | |
| *F21W 111/00* | (2006.01) | |
| *F21Y 101/00* | (2016.01) | |
| *F21Y 105/10* | (2016.01) | |

(52) U.S. Cl.
CPC .......... *H05K 3/301* (2013.01); *F21W 2111/00* (2013.01); *F21Y 2101/00* (2013.01); *F21Y 2105/10* (2016.08); *H05K 3/306* (2013.01); *H05K 2201/10113* (2013.01)

(58) Field of Classification Search
CPC .................. H05K 3/301; H05K 3/306; H05K 2201/10113; F21Y 2105/10; F21Y 2101/00; F21W 2111/00
USPC .... 362/652, 655, 656, 657, 658, 659, 23.19, 362/249.02
See application file for complete search history.

(56) References Cited

U.S. PATENT DOCUMENTS

| | | | | |
|---|---|---|---|---|
| 7,344,296 B2* | 3/2008 | Matsui | ...................... | F21K 9/00 362/249.01 |
| 7,549,786 B2* | 6/2009 | Higley | .................... | F21L 4/027 362/640 |
| 8,876,336 B2* | 11/2014 | Suzuki | ................ | F21V 19/0015 362/311.02 |
| 2012/0020086 A1* | 1/2012 | Kataoka | .................... | F21V 5/04 362/249.02 |

* cited by examiner

*Primary Examiner* — Laura Tso
(74) *Attorney, Agent, or Firm* — Steven Reiss

(57) ABSTRACT

An indicating device includes an enclosure and an indicating lamp. The enclosure includes a base. The base defines a receiving space and an opening communicating with the receiving space. When the indicating lamp is received in the receiving space, the base partially shields the indicating lamp allowing light from the indicating lamp to be transmitted only through the opening.

15 Claims, 6 Drawing Sheets

VISUAL INDICATING DEVICE

FIELD

The subject matter herein generally relates to indicating devices.

BACKGROUND

Illuminated device, such as illuminated buttons, are employed in many electronic devices. For example, a typical personal computer has power buttons. Each of the power buttons includes a panel and a built-in backlight which is often a light emitting diode ("LED"). Light beams transmitted from the LED can pass out of the power button. That is, when power is on, the LED emits light to make a user aware of the "power on" status of the computer and/or the display.

BRIEF DESCRIPTION OF THE DRAWINGS

Implementations of the present technology will now be described, by way of example only, with reference to the attached figures.

DETAILED DESCRIPTION

Figure 1:
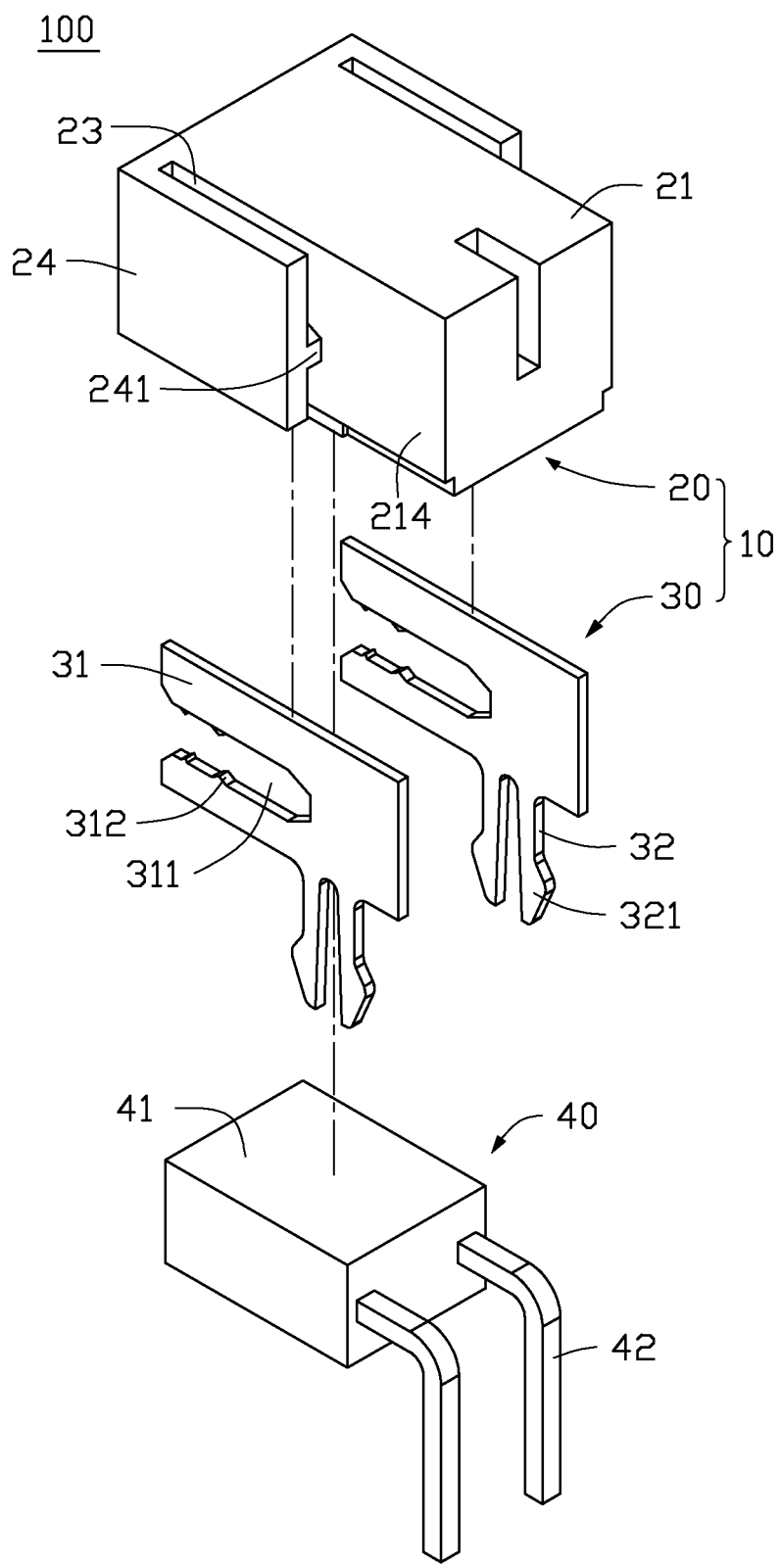
FIG. 1 is an exploded, isometric view of an embodiment of an indicating device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

The present disclosure is described in relation to an indicating device. The indicating device includes an enclosure and an indicating lamp. The enclosure includes a base. The base defines a receiving space and an opening communicating with the receiving space. When the indicating lamp is received in the receiving space, the base partially shields the indicating lamp allowing light from the indicating lamp to be transmitted only through the opening.

Figure 2:
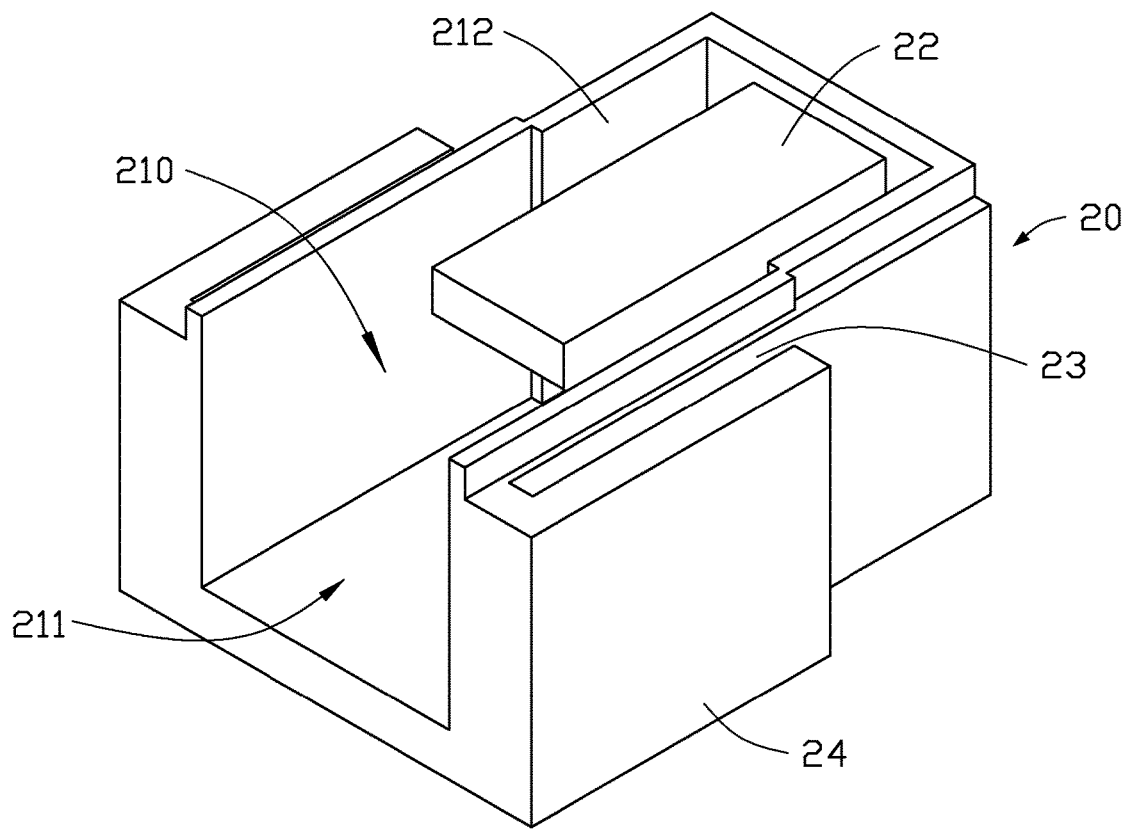
FIG. 2 is isometric view of a base of the indicating device of FIG. 1.

FIGS. 1 and 2 illustrate an embodiment of an indicating device 100. The indicating device 100 includes an enclosure 10 and an indicating lamp 40 can be received in the enclosure 10.

The enclosure 10 can include a base 20 and two clipping members 30 can be attached to the base 20. The base 20 can include a base body 21 and two securing arms 24 extending from opposite sides of the base body 21. The base body 21 defines a receiving space 210 and an opening 211 communicating with the receiving space 210. In at least one embodiment, the receiving space 210 can be defined by three side plates of the base body 21 coupled together. The receiving space 210 is used to receive the indicating lamp 40, and light emitted by the indicating lamp 40 can be emitted out of the base body 21 via the opening 211. A securing plate 22 is located in the receiving space 210 and can be deformable to secure the indicating lamp 40. A receiving slot 212 can be defined in and through the securing plate 22.

An accommodating slot 23 can be defined in each securing arm 24 and each side of base body 21. A securing portion 241 extends from each securing arm 24 and is located in the accommodating slot 23. In at least one embodiment, the two securing arms 24 are substantially parallel and are also substantially parallel to a side panel 214 of the base body 21.

Each clipping member 30 can include a base panel 31 and two pins 32 extending downwardly from the base panel 31. A clipping slot 311 is defined in the base panel 31, and a plurality of engaging tabs 312 is located on opposite edges of clipping slot 311. The plurality of engaging tabs 312 can be engaged with the securing portion 241 to secure the clipping member 30 to the base body 21. A lock 321 is located on a free end of each pin 32 and can be deformable to engage in a hole 201 of a motherboard 200 (see FIG. 5).

The indicating lamp 40 can include a main body 41 and two cables 42 extending from the main body 41. The main body 41 can be received in the receiving space 210 and is secured to the securing plate 22, so that the light emitted by the main body 41 can be emitted out of the base body 21 via the opening 211. The two cables 42 can be received in the two receiving slots 212, and extend out of the base body 21 to electronically couple with the motherboard, and the motherboard can be supply power for the indicating lamp 40.

Figure 3:
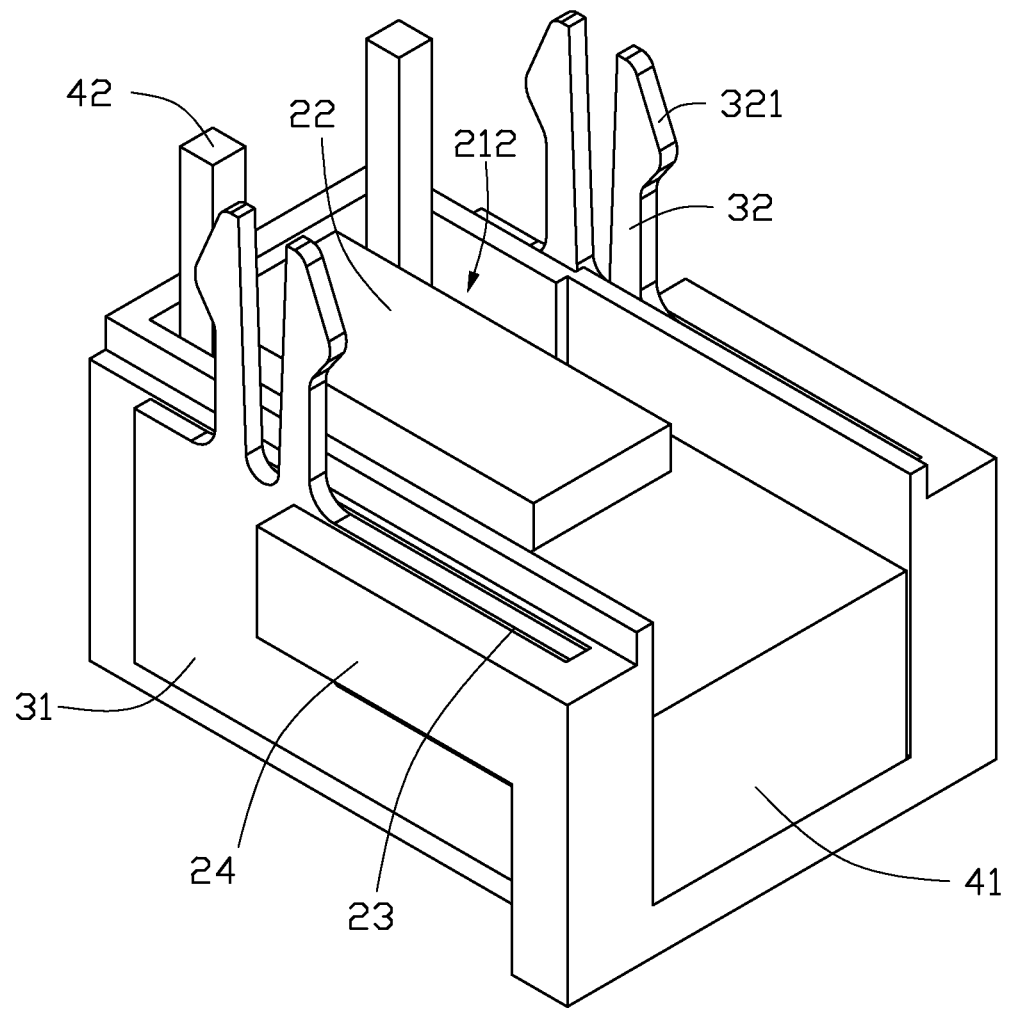
FIG. 3 is an assembled view of the indicating device of FIG. 2
Figure 4:
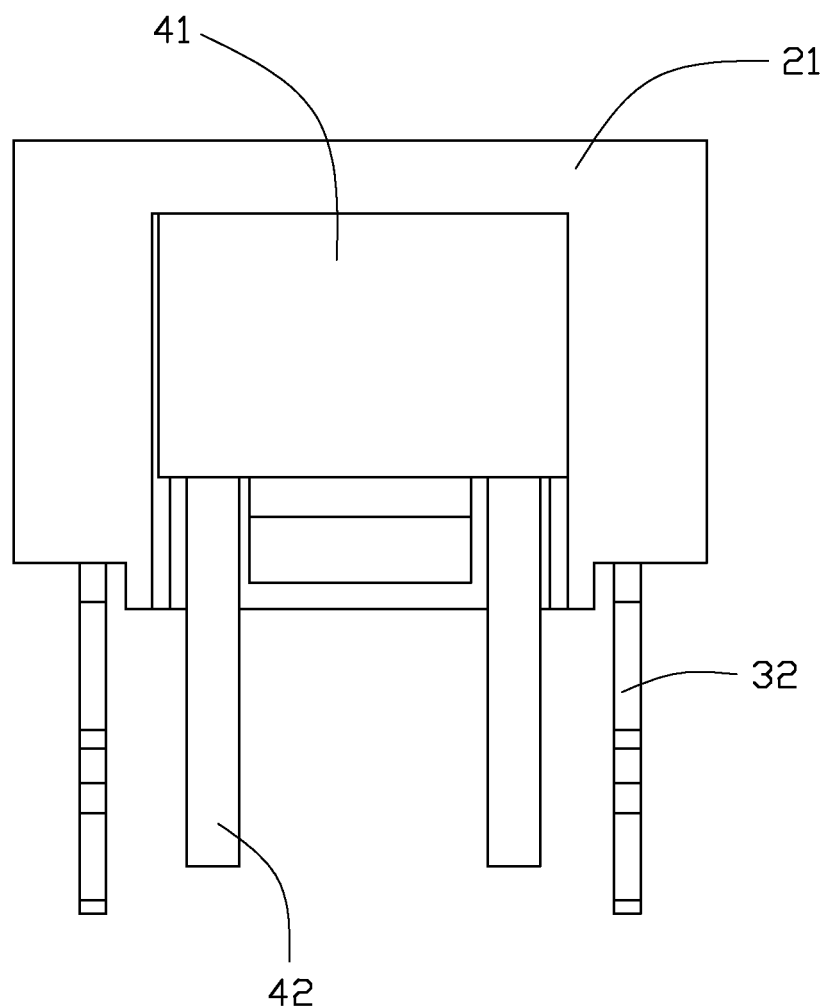
FIG. 4 is similar to FIG. 3, but the indicating device is viewed from a different angle.

FIGS. 3 and 4 illustrate an assembled view of the indicating device 100. In assembly, the main body 41 is located in the receiving space 210, and the two cables 22 are received in the two receiving slots 212 respectively. The securing plate 22 is pressed on the main body 41 to secure the indicating lamp 40 to the base 20. Each base panel 31 is inserted into the accommodating slot 23 for allowing the securing portion 24 to be located in the clipping slot 311. The plurality of engaging tabs 312 can abut the top portion and the bottom portion of the securing portion 24 to secure the clipping member 30 to the securing arm 24. Thereby, the indicating device 100 can be assembled.

Figure 5:
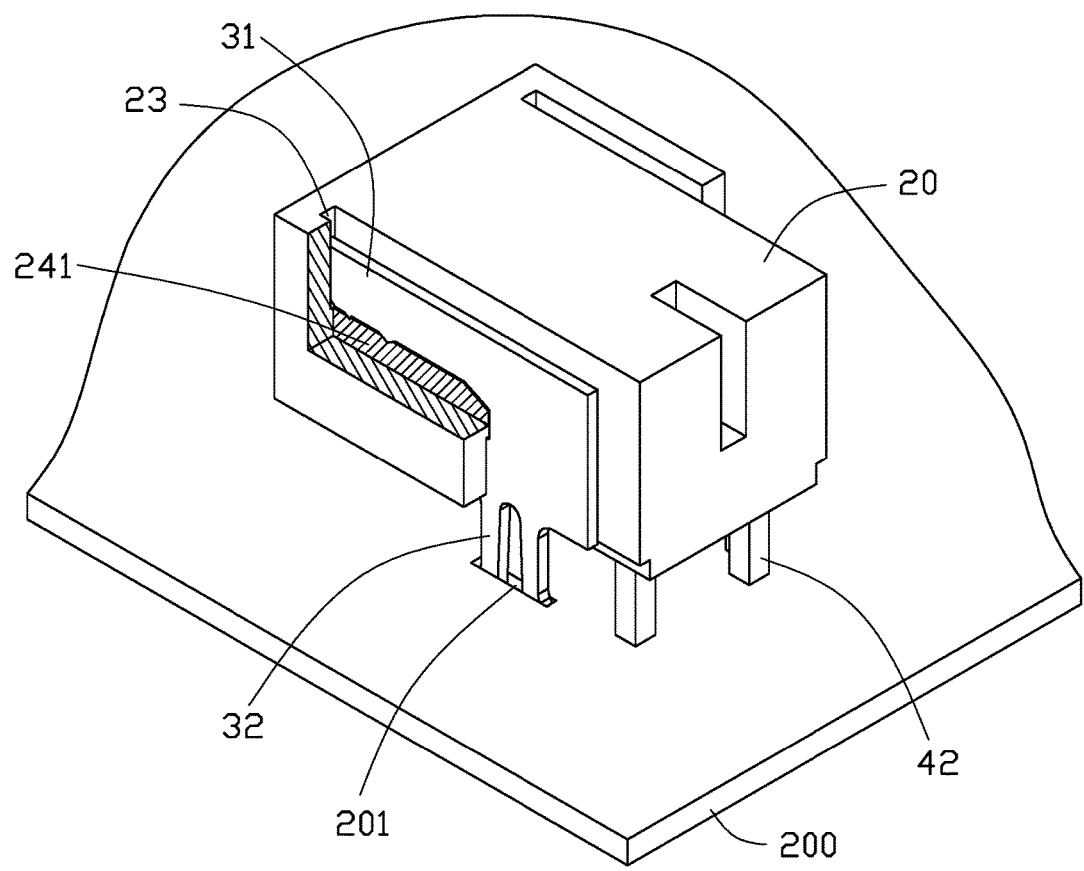
FIG. 5 is an assembled view of the indicating device of FIG. 1 and a motherboard.
Figure 6:
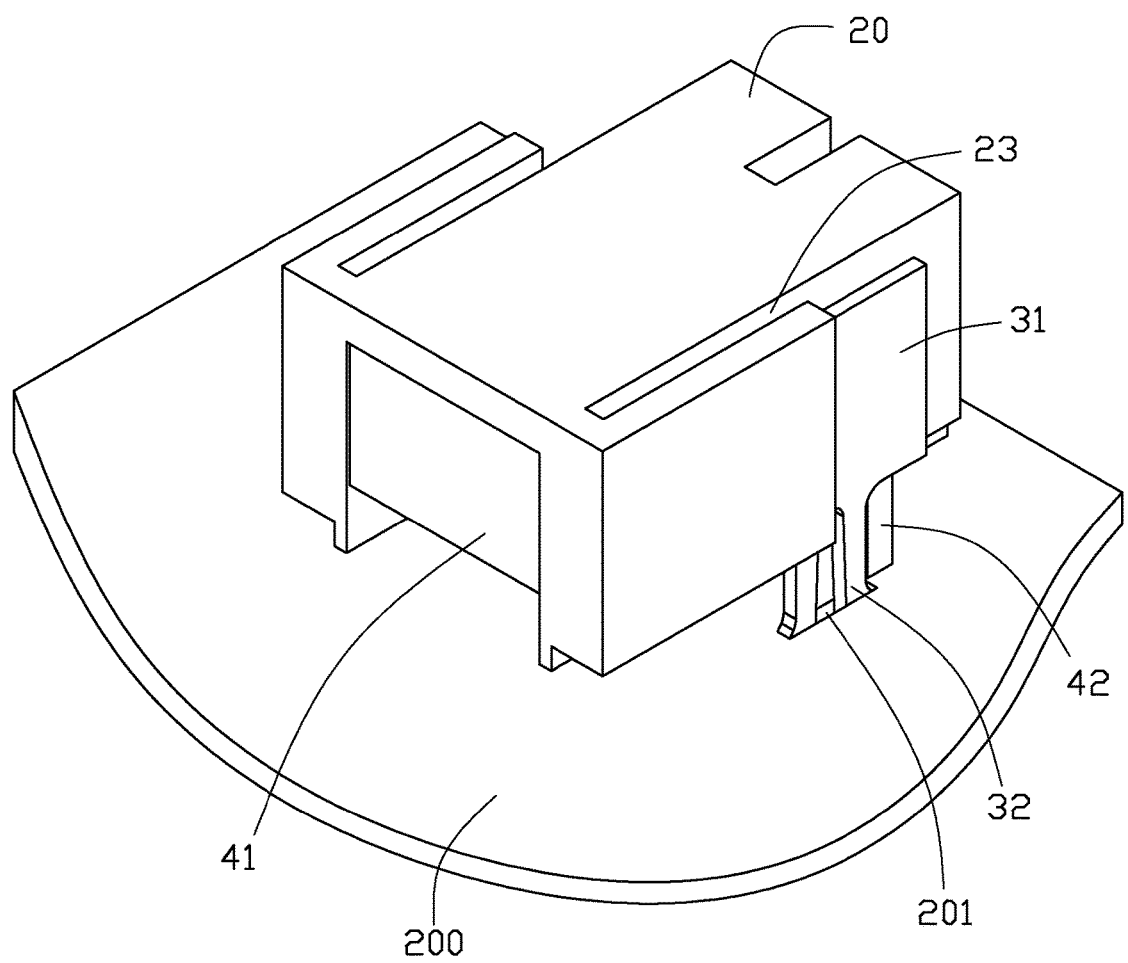
FIG. 6 is similar to FIG. 5, but the indicating device and motherboard are viewed from a different angle.

FIGS. 5 and 6 illustrate the indicating device 100 secured to the motherboard 200. The two locks 321 of the clipping member 30 are deformed to engage in the hole 201 of the motherboard 200. The two cables 42 are electronically coupled to the motherboard 200, so that the motherboard 200 can supply power for the indicating lamp 40. The indicating lamp 40 is received in the receiving space 210 that is defined by the main body 21 and is shielded by each side of the main body 21, so almost all the light emitted by the indicating lamp 40 can pass out of the base body 21 via the opening 211.

The embodiments shown and described above are only examples. Many details are often found in the art such as the other features of an indicating device. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. An indicating device comprising:
   an indicating lamp;
   an enclosure comprising a base; the base defining a receiving space configured to receive the indicating lamp and an opening communicating with the receiving space; and
   wherein when the indicating lamp is received in the receiving space, the base partially shields the indicating lamp allowing light from the indicating lamp to be transmitted only through the opening; and
   wherein the base further comprises a securing arm, the enclosure further comprises a clipping member engaged with the securing arm, and the clipping member is configured to be secured to a motherboard.

2. The indicating device of claim 1, wherein the base comprises a securing plate located in the receiving space, and the indicating lamp is secured to the securing plate.

3. The indicating device of claim 2, wherein the base defines two receiving slots arranged at opposite sides of the securing plate, the indicating lamp comprises a main body and two cables coupled to the main body, the main body is secured to the securing plate, and the two cable are received in the two receiving slots and are configured to electronically coupled to a motherboard.

4. The indicating device of claim 1, wherein the clipping member comprises a base panel, the base panel defines a clipping slot, the securing arm comprises a securing portion, and the securing portion is engaged in the clipping slot.

5. The indicating device of claim 4, wherein a plurality of engaging tabs are located on opposite edges of the clipping slot, and the plurality of engaging tabs are engaged with the securing portion.

6. The indicating device of claim 4, wherein the base further comprises a base body, an accommodating slot is defined between the securing arm and the base body, and the base panel is received in the accommodating slot.

7. The indicating device of claim 4, wherein the clipping member further comprises a pin with a lock, and the lock is configured to engage in a hole of the motherboard.

8. The indicating device of claim 7, wherein the base body comprises a side panel, and the securing arm is substantially parallel to the side panel.

9. An indicating device comprising:
   an enclosure comprising a base and a clipping member engaged with the base; the base defining an opening; and
   an indicating lamp attached to the base;
   wherein the clipping member is configured to engage with a motherboard to secure the indicating device to the motherboard, the indicating lamp is received in the receiving space, the base partially shields the indicating lamp allowing light from the indicating lamp to be transmitted only through the opening; and
   wherein the base further comprises a base body and a securing arm substantially parallel to a side panel of the base body, and the clipping member is located between the side panel and the base body.

10. The indicating device of claim 9, wherein the base comprises a receiving space and a securing plate located in the receiving space, and the indicating lamp is received in the receiving space and is secured to the securing plate.

11. The indicating device of claim 10, wherein the base defines two receiving slots arranged at opposite sides of the securing plate, the indicating lamp comprises a main body and two cables coupled to the main body, the main body is secured to the securing plate, and the two cable are received in the two receiving slots and are configured to electronically coupled to a motherboard.

12. The indicating device of claim 9, wherein the clipping member comprises a base panel, the base panel defines a clipping slot, the securing arm comprises a securing portion, and the securing portion is engaged in the clipping slot.

13. The indicating device of claim 12, wherein an accommodating slot is defined between the securing arm and the side panel, and the securing portion is located in the accommodating slot.

14. The indicating device of claim 12, wherein a plurality of engaging tabs are located on opposite edges of the clipping slot, and the plurality of engaging tabs are engaged with the securing portion.

15. The indicating device of claim 9, wherein the clipping member further comprises a pin with a lock, and the lock is configured to engage in a hole of the motherboard.

\* \* \* \* \*